(12) United States Patent
Xu et al.

(10) Patent No.: US 10,833,674 B2
(45) Date of Patent: Nov. 10, 2020

(54) SWITCH DEVICE WITH INPUT LIMITING FUNCTION

(71) Applicant: Faraday Technology Corp., Hsin-Chu (TW)

(72) Inventors: Feng Xu, Hsin-Chu (TW); Shu Dong Wu, Hsin-Chu (TW); Zhen Liang Zhang, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/554,652

(22) Filed: Aug. 29, 2019

(65) Prior Publication Data

US 2020/0304120 A1  Sep. 24, 2020

(30) Foreign Application Priority Data

Mar. 20, 2019 (CN) .......................... 2019 1 0214525

(51) Int. Cl.
*H03K 17/687* (2006.01)
*H03K 19/20* (2006.01)
*H03M 1/12* (2006.01)

(52) U.S. Cl.
CPC ......... *H03K 17/6872* (2013.01); *H03K 19/20* (2013.01); *H03M 1/12* (2013.01)

(58) Field of Classification Search
CPC ....... H01L 27/00; H01L 27/092; H03K 17/00; H03K 17/162; H03K 17/6872; H03K 17/693; H03K 19/00; H03K 19/00315; H03K 19/20; H03M 1/00; H03M 1/12
USPC ......................................................... 327/437
See application file for complete search history.

(56) References Cited

U.S. PATENT DOCUMENTS 6,567,024 B1 * 5/2003 Ishikawa ............ H03K 17/6874
257/370
2017/0148506 A1 * 5/2017 Kwack .................. G11C 11/419

* cited by examiner

*Primary Examiner* — Lincoln D Donovan
*Assistant Examiner* — Dave Mattison
(74) *Attorney, Agent, or Firm* — Winston Hsu

(57) ABSTRACT

A switch device including a switch circuit and switch controller. The switch circuit comprises first and second switches to selectively enable a path between an input terminal and an output terminal. The switch controller refers to a selection signal and a switch signal to respectively generate a first switch control signal at a first switch control signal output terminal and a second switch control signal at a second switch control signal output terminal. When the voltage level of an input signal at the input terminal is larger than a power voltage, the switch controller generates the first switch control signal and the second switch control signal capable of turning off the switch circuit. When the voltage level of the input signal is not larger than the power voltage, the switch controller generates the first switch control signal and the second switch control signal according to the switch signal.

12 Claims, 5 Drawing Sheets

SWITCH DEVICE WITH INPUT LIMITING FUNCTION

BACKGROUND OF THE INVENTION

1. Field of the Invention

The present invention relates to a switch device, and more particularly, to a switch device with an input limiting function.

2. Description of the Prior Art

In related arts, the transmission gate is often used for transmitting control signals in an integrated circuit (IC). In some situations, when the transmission gate encounters the situation where the voltage level of the input signal is larger than the power voltage level, the P-type metal-oxide-semiconductor field effect transistors (PMOS) in the transmission gate will be passively conducted, making the transmission gate unable to effectively disable the signal transmission path in order to turning off the switch. On the other hand, the Parasitic PN junction in the PMOS of the transmission gate may also generate leakage current, which has negative influence on the function of blocking signals. To address this issue, a related art technique has proposed a bootstrap switch circuit to mitigate the defects of the transmission gate. Since the bootstrap switch is implemented based on the N-type metal-oxide-semiconductor field effect transistors (NMOS), the issue of PMOS being passively conducted can be solved, i.e. the signal transmission path can be effectively disabled when the voltage level of the input signal is larger than the power voltage level. However, when the voltage level of the input signal is larger than the power voltage level, a portion of bootstrap switches may cause the voltage difference between the drain/source/gate of the NMOS to be higher than the power voltage, which raises some reliability issues. Therefore, there is a need for a novel method to solve the aforementioned problem.

SUMMARY OF THE INVENTION

This in mind, an objective of the present invention is to provide an improved bootstrap switch device to solve the aforementioned problem. The switch device of the present invention may limit the voltage level of the input signal, and more particularly, when the voltage level of the input signal exceeds the power voltage, the switch can be turned off in order to disable the signal path between the input terminal and the output terminal. The switch device of the present invention may effectively solve the reliability issue resulted from the voltage difference between the drain/source/gate of the NMOS being larger than the power voltage. In addition, the leakage current problem will not exist in the switch device of the present invention.

An embodiment of the present invention provides a switch device that comprises a switch circuit and a switch controller. The switch circuit comprises a first switch and a second switch arranged to selectively enable a path between an input terminal and an output terminal, wherein the first switch and the second switch are controlled by a first switch control signal and a second switch control signal, respectively. The switch controller is arranged to refer to a selection signal and a switch signal to respectively generate the first switch control signal at a first switch control signal output terminal, and generate the second switch control signal at a second switch control signal output terminal. When the voltage level of an input signal at the input terminal is larger than a power voltage, the switch controller generates the first switch control signal and the second switch control signal that are capable of turning off the switch circuit. When the voltage level of the input signal is not larger than the power voltage, the switch controller generates the first switch control signal and the second switch control signal according to the switch signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
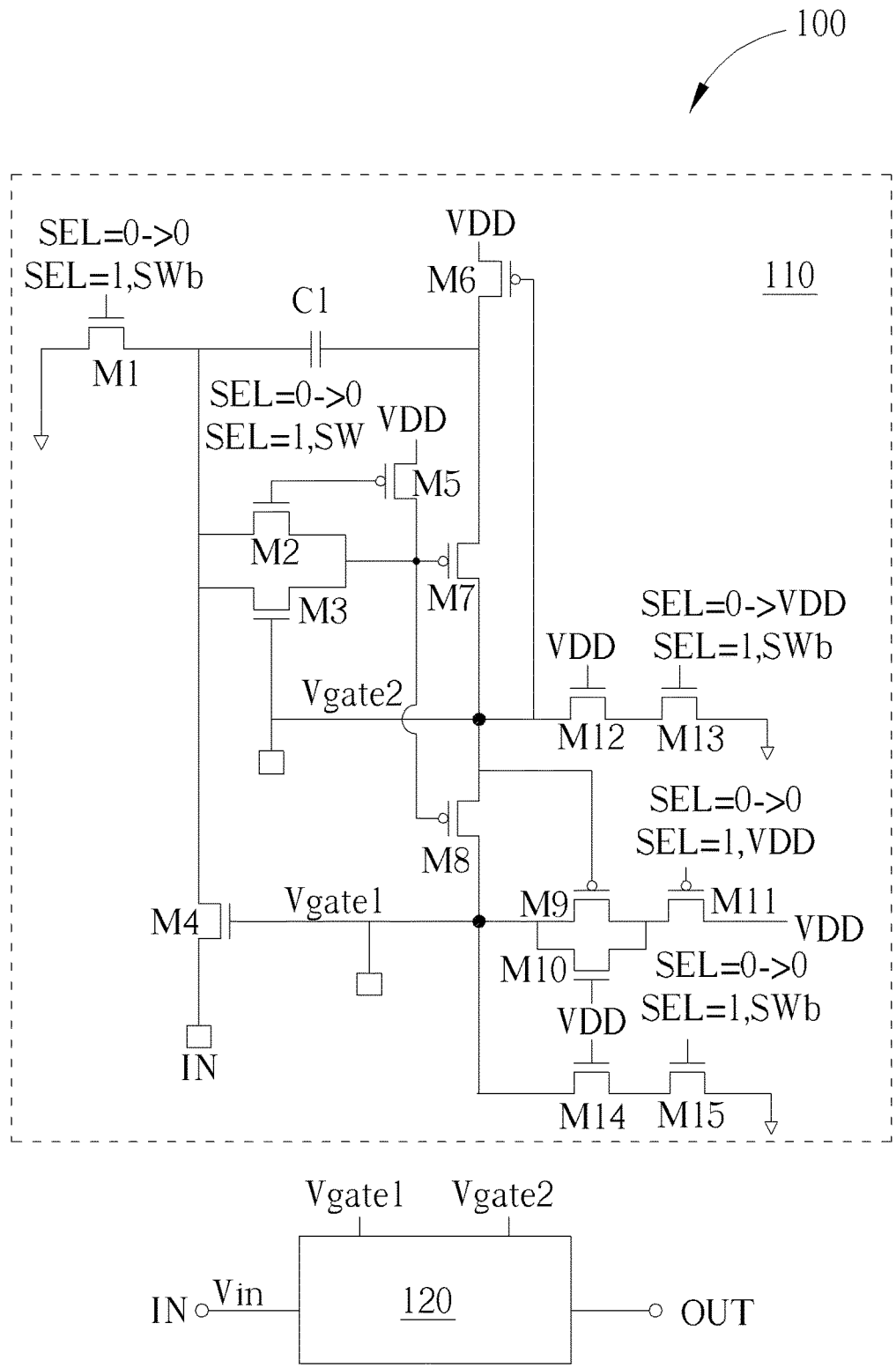
FIG. 1 is a detailed circuit diagram illustrating a switch device according to an embodiment of the present invention.
Figure 2:
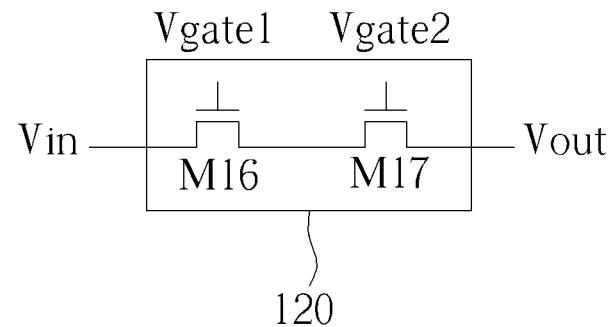
FIG. 2 is a detailed circuit diagram illustrating a switch circuit according to an embodiment of the present invention.

To solve the problem existing in related arts, the present invention proposes a switch device improved based on a bootstrap switch. Refer to FIG. 1, where the switch device 100 is composed of a switch controller 110 and a switch circuit 120. In an embodiment, the switch circuit 120 may comprise the transistors M16 and M17. As shown in FIG. 2, the gates of the transistor M16 and M17 are respectively controlled by the switch control signals Vgate1 and Vgate2 generated by the switch controller 110, and under the control of the switch control signals Vgate1 and Vgate2, the gates of the transistor M16 and M17 are also arranged to selectively deliver the input signal Vin at the input terminal as the output terminal Vout, and thereby achieve the functions of a switch.

The switch device 100 of the present invention comprises the following two main operation states: (1) When the input signal Vin is larger than the power voltage VDD, the switch circuit 120 is turned off to disable the signal path between the input terminal IN and the output terminal OUT; and (2) When the input signal Vin is not larger than the power voltage VDD, the signal path between the input terminal IN and the output terminal OUT is enabled or disabled based on the state of the switch signal SW. The switch controller 110 may switch the operation state according to the selection signal SEL. How to achieve the aforementioned effects via the circuit shown in FIG. 1 is explained as follows.

Firstly, the signal at the gate of the transistor M1 is required to show a low logic level when the selection signal SEL is in a low logic level, and to show an inverse switch signal SWb (which is an inverse version of the switch signal SW) when the selection signal SEL is in a high logic level. More specifically, the gate of the transistor M1 may be controlled by the AND gate G1 shown in FIG. 4, wherein the AND gate G1 may provide an AND operation result at the output terminal according to the inverse switch signal SWb and the selection signal SEL at the input terminal. Moreover, the transistor M1 may be coupled to a terminal of the transistor M6 via the capacitor C1 and a terminal of the transistor M4. Another terminal of the transistor M4 is coupled to the input terminal IN of the switch device 100, to receive the input signal Vin at the input terminal IN. Furthermore, the signal at the gate of the transistor M4 is the switch control signal Vgate1.

Next, a terminal of the transistor M1 is also coupled to a node that coupled to both the transistors M2 and M3. The signal at the gate of the transistor M2 is required to show a low logic level when the selection signal SEL is in a low logic level, and shows the switch signal SW when the selection signal SEL is in a high logic level. Hence, the gate of the transistor M2 may be controlled by the AND gate G2 shown in FIG. 4, wherein the gate of the transistor M2 is coupled to the output terminal of the AND gate G2, and the AND gate G2 provides an operation result at the output terminal according to the switch signal SW and the selection signal SEL at the input terminal. In addition, the signal at the gate of the transistor M3 is the switch control signal Vgate2. On the other hand, the gate of the transistor M2 is coupled to the gate of the transistor M5, and therefore the gate of the transistor M5 may be controlled by the AND gate G2 shown in FIG. 4 in a similar way. A terminal of the transistor M5 is coupled to the power voltage VDD, and another terminal of the transistor M5 is coupled to the gates of the transistors M7 and terminals of the transistors M2 and M3.

A terminal of the transistor M6 is coupled to the power voltage VDD, and another terminal of the transistor M6 is coupled to a terminal of the transistor M1 via the capacitor C1, and also coupled to a terminal of the transistor M7. The gate of the transistor M7 is coupled to another terminal that is coupled to the transistors M2 and M3. A terminal of the transistor M7 is arranged to receive the switch control signal Vgate2, and is coupled to a terminal of the transistor M8. Further, the gate of the transistor M8 is coupled to a terminal of the transistor M5, the gate of the transistor M7, and terminals of the transistors M2 and M3.

The gate of the transistor M12 is controlled by the power voltage VDD, wherein the signal at the gate of the transistor M13 is required to show the power voltage VDD when the selection signal SEL is in a low logic level, and is required to show the inverse switch signal SWb when the selection signal SEL is in a high logic level. Hence, the gate of the transistor M13 may be controlled by the output terminal of the inverse AND gate G3 shown in FIG. 4, wherein the inverse AND gate G3 provides an NAND operation result at the output terminal according to the switch signal SW and the selection signal SEL on the input terminal. Further, a terminal of the transistor M12 is arranged to receive the switch control signal Vgate2, and a terminal of the transistor M13 is coupled to the ground.

Figure 4:
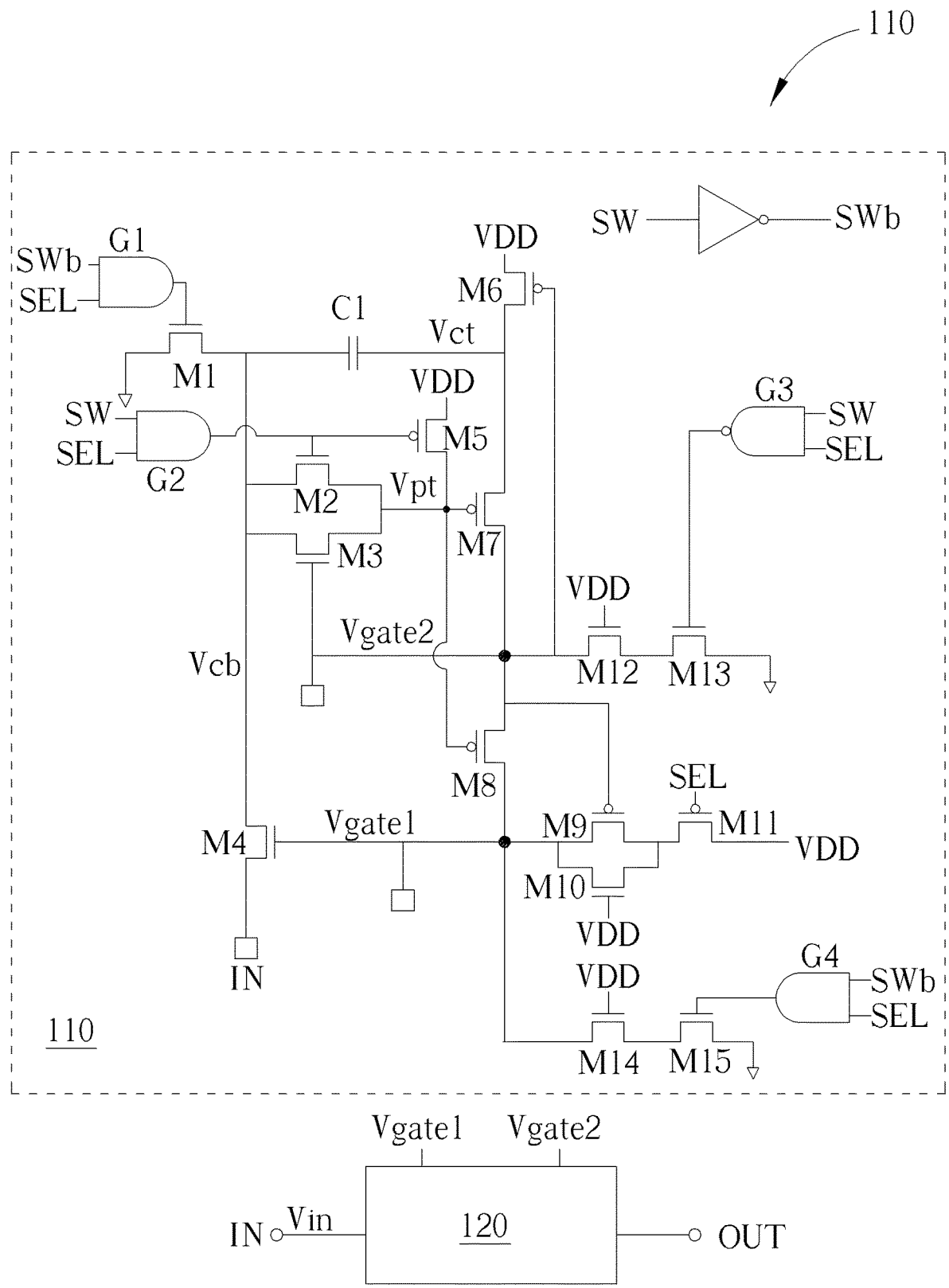
FIG. 4 is a detailed circuit diagram illustrating a switch device according to another embodiment of the present invention.

The gates of the transistors M9 and M10 that are coupled to each other are respectively controlled by the switch control signal Vgate2 and the power voltage VDD. In addition, the gate of the transistor M9 is coupled to the gates of the transistors M3 and M6, and terminals of the transistors M7, M8 and M12. A node coupled to both the transistor M9 and the transistor M10 is further coupled to the gate of the transistor M4 and a terminal of the transistor M8, and is arranged to receive the switch control signal Vgate1. Another node coupled with the transistor M9 and the transistor M10 is coupled to a terminal of the transistor M11. The signal at the gate of the transistor M11 is required to show a low logic level when the selection signal SEL is in a low logic level, and to show the power voltage VDD when the selection signal SEL is in a high logic level. An example of the gate of the transistor M11 is shown in FIG. 4, which is directly controlled by the selection signal SEL. Another terminal of the transistor M11 is coupled to the power voltage VDD.

The gate of the transistor M14 is controlled by the power voltage VDD. The signal at the gate of the transistor M15 is required to show a low logic level when the selection signal SEL is in a low logic level, and to show the inverse switch signal SWb when the selection signal SEL is in a high logic level. Hence, the signal at the gate of the transistor M15 may be controlled by the output terminal of the AND gate G4 shown in FIG. 4, wherein the AND gate G4 provides an operation result at the output terminal according to the inverse switch signal SWb and the selection signal SEL at the input terminal. Further, a terminal of the transistor M14 is coupled to the gate of the transistor M4, and terminals of the transistors M8, M9 and M10 are arranged to receive the switch control signal Vgate1, and a terminal of the transistor M15 is coupled to the ground.

Regarding the controller 110, the selection signal SEL is controlled by a detection circuit (not shown), when the input signal Vin at the input terminal IN is larger than the power voltage VDD, the detection circuit makes the selection signal SEL drop (e.g. dropping to a low logic level); when the input signal Vin at the input terminal IN is not larger than the power voltage VDD, the detection circuit makes selection signal SEL rise (e.g. rising to a high logic level). Further, the switch signal SW is arranged to determine whether to control the switch circuit 120 to be conducting or non-conducting. The low logic level of the switch signal SW suggests that the switch circuit 120 is currently non-conducting, while the high logic level of the switch signal SW suggests that the switch circuit 120 is currently conducting. According to the selection signal SEL and the switch signal SW, the switch controller 110 may generate corresponding switch control signals Vgate1 and Vgate2 to control the switch circuit 120, thereby achieving following goals: (1) When input signal Vin is larger than the power voltage VDD, turn off the switch circuit 120 and disable the signal path between the input terminal IN and the output terminal OUT; (2) When the input signal Vin is not larger than the power voltage VDD, enable or disable the signal path between the input terminal IN and the output terminal OUT according to the switch signal SW.

Figure 3:
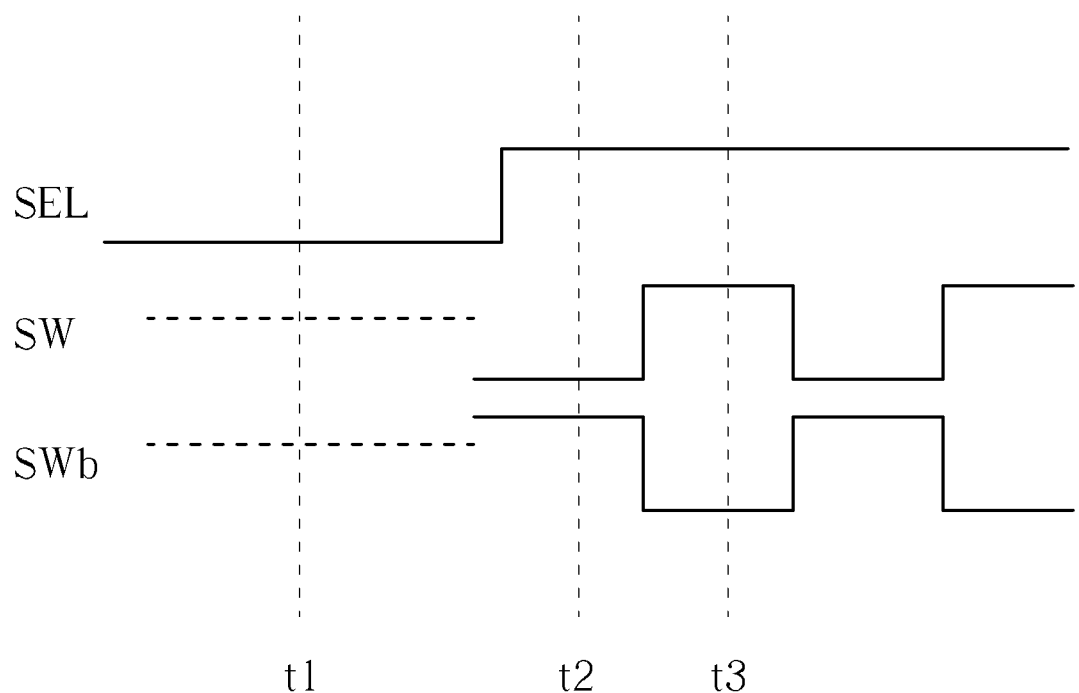
FIG. 3 is a signal waveform diagram according to an embodiment of the present invention.

The operations of the switch controller 110 may be referred to FIGS. 3-4 and the information in the following table.

| Terminals | Timing T1 | Timing T2 | Timing T3 |
|---|---|---|---|
| SEL | 0 | VDD | VDD |
| SW | — | 0 | VDD |
| SWb | — | VDD | 0 |
| Vcb | Vin (Vin ≤ VDD) VDD (Vin > VDD) | 0 | Vin |
| Vct | VDD | VDD | "Vin + VDD" |
| Vpt | VDD | VDD | Vin |
| Vgate1 | VDD | 0 | "Vin + VDD" |
| Vgate2 | 0 | 0 | "Vin + VDD" |

Initially, at the timing T1, the selection signal SEL is in a low logic level, which suggests that the level of the input signal Vin is larger than the power voltage level VDD. Hence, the switch controller 110 also makes the switch circuit 120 non-conducting and thereby disables the signal transmission path between the input terminal IN and the output terminal OUT. When the selection signal SEL is in a low logic level, with the operations of the logic gates G1-G4, the voltages at the gates of the transistors M1, M2, M5 and M15 may be 0, and the signal at the gate of the transistor M13 is the VDD. Further, when input signal Vin is not larger than the power voltage VDD, the voltage level of the terminal Vcb is approximately equal to the input signal Vin, and when the input signal Vin is larger than the power voltage VDD, the voltage level at the terminal Vcb is approximately equal to the power voltage VDD. The voltages at the terminals Vct and Vpt are VDD. On the other hand, both the transistor M12 and the transistor M13 are in the conducting state, making the voltage level of the switch control signal Vgate2 drop to 0. Since the transmission gate formed by the transistor M9 and the transistor M10 is in the conducting state due to the voltage level of the switch control signal Vgate2 dropping to 0 and the selection signal SEL is in a low logic level, the transistor M11 will be in the conducting state. Therefore, the switch control signal Vgate1 will rise to the voltage VDD. In addition, when the selection signal SEL is in a low logic level, the voltage level of the switch control signal Vgate1 is VDD, and the voltage level of the switch control signal Vgate2 is 0. In this way, the switch circuit 120 can be effectively turned off even when the input signal Vin is larger than the power voltage VDD, which provides the effect of disabling the signal transmission path between the input terminal IN and the output terminal OUT.

At the timing T2, the selection signal SEL is in a high logic level, which suggests that the level of the input signal Vin is not larger than the power voltage VDD. Hence, the switch controller 110 may control the switch circuit 120 according to the switch signal SW to determine whether to enable or disable the signal transmission path between the input terminal IN and the output terminal OUT. At the timing T2, the switch signal SW is in a low logic level, and via the operations of the logic gates G1-G4, the voltages at the gates of the transistors M1, M13 and M15 are VDD, and the voltages at the gates of the transistors M2, M5 are 0. Further, the voltage of the terminal Vcb is 0, and the voltages at the terminals Vct and Vpt are VDD. On the other hand, since the transistors M12 and M13 are both in the conducting state, the voltage level of the switch control signal Vgate2 is 0, Further, both the transistors M14 and M15 are in the conducting state, and the voltage level of the switch control signal Vgate1 is also 0. Hence, at the timing T2, the switch controller 110 may turn off the switch circuit 120 according to the low logic level of the switch signal SW, in order to disable the signal transmission path between the input terminal IN and the output terminal OUT.

At the timing T3, the selection signal SEL is in a high logic level, which suggests that the level of the input signal Vin is not larger than the power voltage level VDD, and the switch controller 110 refers to the switch signal SW to control the switch circuit 120 to determine whether to enable or disable the signal transmission path between the input terminal IN and the output terminal OUT. At the timing T3, the switch signal SW is in a high logic level, and therefore the voltages at the gates of the transistors M1, M13 and M15 are all 0, and the voltages at the gate of the transistors M2, M5 are VDD. Further, the voltage at the terminal Vcb is Vin, the voltage at the terminal Vct is "Vin+VDD" (which is resulted from the electrical charges stored in the capacitor C1), and the voltage at the terminal Vpt is Vin. In this way, the voltage level at the switch control signal Vgate2 is "Vin+VDD", and the voltage level at the switch control signal Vgate1 is also "Vin+VDD". Hence, at the timing T3, the switch controller 110 turns on the switch circuit 120 according to the high logic level of the switch signal SW, thereby enabling the signal path between the input terminal IN and the output terminal OUT.

It should be noted that in the above illustrations, the selection signal SEL is used to determine the operation mode of the switch device 100, and when the input signal Vin is larger than the power voltage VDD, the selection signal SEL is set to a low logic level, thus turning off the switch circuit 120. When the Vin is not larger than the power voltage VDD, the enabling/disabling of the switch circuit 120 is basically controlled by the switch signal SW/SWb. In other embodiments of the present invention, however, turning off the switch circuit 120 may be directly controlled by the selection signal SEL without using the switch signal SW/SWb. Further, when the input signal Vin is not larger than the power voltage VDD, the switch circuit 120 may be turned off by setting the selection signal SEL to a low logic level. In this situation, if there is a need for turning on the switch circuit 120, it is still necessary to set the selection signal SEL to high logic level and to use the switch signal SW/SWb to control the switch circuit 120.

Figure 5:
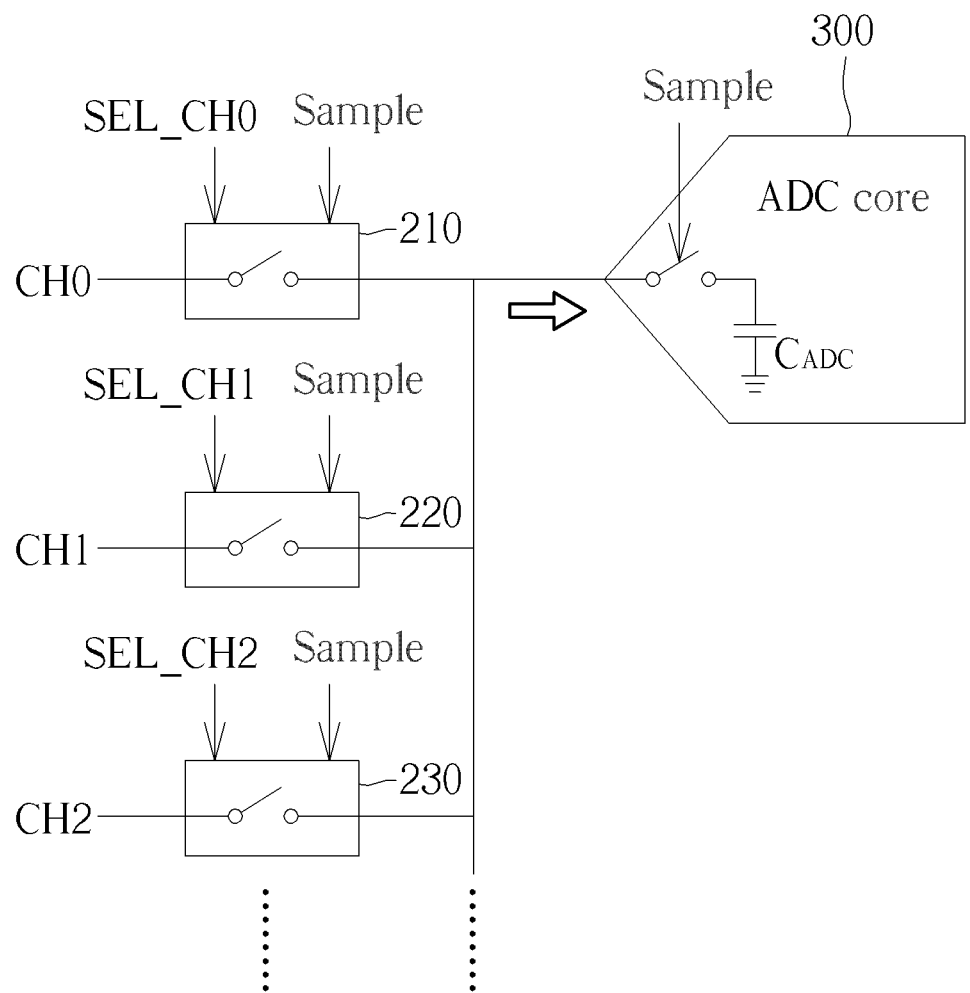
FIG. 5 is a diagram illustrating the architecture of a multi-channel analog-to-digital convertor applied to the switch device of the present invention.

The switch device 100 of the present invention may be further applied to a multi-channel successive approximation ADC/SAR-ADC. As shown in FIG. 5, the multi-channel SAR-ADC core 300 is arranged to perform analog-to-digital conversions upon signals on the channels CH0, CH1, CH2 (and so on), wherein each channel of the channels CH0, CH1, CH2 (and so on) may be coupled to the multi-channel SAR-ADC core 300 via the channel switch devices 210, 220, 230 (and so on), respectively. Each of the channel switch devices 210, 220, 230 (and so on) may be implemented with the switch device 100 of the present invention. In addition, the channel selection signals SEL_CH0, SEL_CH1, SEL_CH2 (and so on) may be used as the switch signal SW for the channel switch devices 210, 220, 230 (and so on), thereby controlling the control thereof. The multi-channel SAR-ADC core 300 may sample the signals on the channels one-by-one under the control of the channel selection signals SEL_CH0, SEL_CH1 and SEL_CH2, to complete the analog-to-digital conversions. With the assist of the switch devices 210, 220, 230 (and so on), the multi-channel SAR-ADC core 300 can be prevented from processing the signals beyond the input voltage range thereof.

Figure 6:
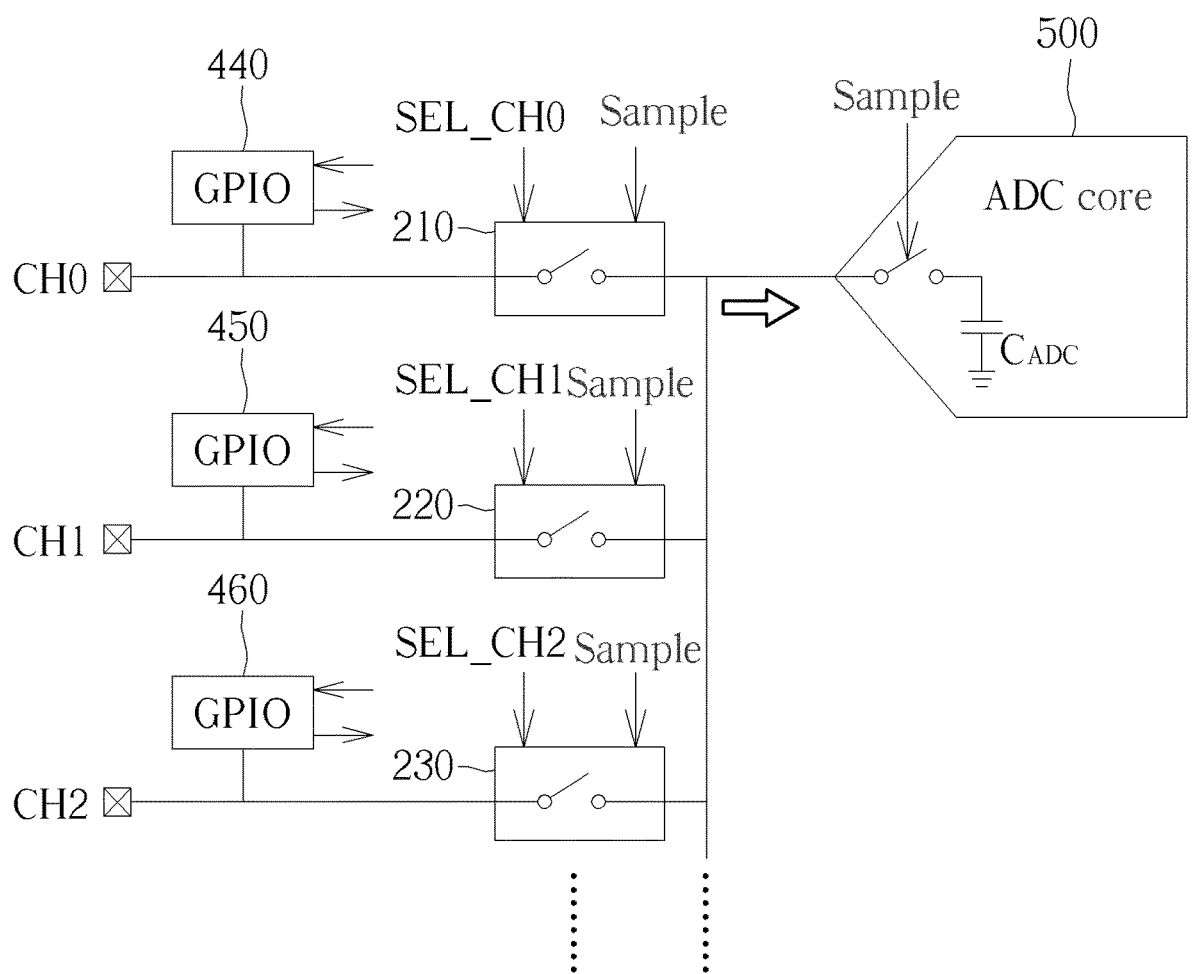
FIG. 6 is another diagram illustrating the architecture of a multi-channel analog-to-digital convertor applied to the switch device of the present invention.

The switch device 100 may be also applied to the combination of the multi-channel SAR-ADC and the General-purpose input/output (GPIO), as shown in FIG. 6. The multi-channel SAR-ADC core 500 is arranged to perform analog-to-digital conversions upon signals on the channels CH0, CH1, CH2 (and so on). Each of the channels CH0, CH1, CH2 (and so on) may be coupled to the multi-channel SAR-ADC core 500 via the channel switch devices 210, 220, 230 (and so on). In addition, each of the channels CH0, CH1, CH2 (and so on) may also be coupled to a GPIO module for other purposes, wherein each of the switch devices 210, 220, 230 (and so on) may be implemented by the switch device 100 of the present invention. In addition, the channel selection signals SEL_CH0, SEL_CH1, SEL_CH2 (and so on) may be used as the switch signal SW of the channel switch devices 210, 220, 230 (and so on) for controlling the conduction thereof. Since the multi-channel SAR-ADC core 500 and the GPIO modules 440-460 share common pins CH0-CH2, the channel switch devices 210-230 may effectively isolate signals that are originally in the GPIO module 440-460 and are with voltage levels exceeding the input voltage of the SAR-ADC core 500.

As can be seen from the above, the present invention realizes a switch device that has input limiting functions. Further, the switch device of the present invention may properly solve problems such as the occurrence of the leakage current in the transmission gate switch circuit, which results in that signals cannot be thoroughly blocked. In addition, the present invention also improves the reliability problem caused by that the voltage difference between the drain/source/gate in the bootstrap switch circuit is higher than the power voltage. Since the switch device of the present invention includes the input limiting functions, it is suitable to be applied to the scenarios where the input voltage range is limited, e.g. the above mentioned SAR-ADC, wherein the switch device of the present invention may be used to properly perform individual sampling upon each of the individual channel signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch device, comprising:
    a switch circuit, comprising a first switch and a second switch, arranged to selectively enable a path between an input terminal and an output terminal, wherein the first switch and the second switch are controlled by a first switch control signal and a second switch control signal, respectively; wherein the first switch is a transistor and the second switch is transistor, wherein the two transistors are a same conduction type; and
    a switch controller, arranged to refer to a selection signal and a switch signal to respectively generate the first switch control signal at a first switch control signal output terminal, and generate the second switch control signal at a second switch control signal output terminal, wherein when the voltage level of an input signal at the input terminal is larger than a power voltage, the switch controller generates the first switch control signal and the second switch control signal that are capable of turning off the switch circuit; and when the voltage level of the input signal is not larger than the power voltage, the switch controller generates the first switch control signal and the second switch control signal according to the switch signal.

2. The switch device of claim 1, wherein the switch controller comprises a second switch control signal generating circuit that comprises:
    a first transistor, wherein having a first terminal coupled to a second switch control signal output terminal, and a gate of coupled to a first referential voltage;
    a second transistor, having a first terminal coupled to the second terminal of the first transistor, and a second terminal coupled to a second referential voltage; and
    a NAND gate, having an output terminal coupled to the gate of the second transistor, and the NAND gate arranged to perform NAND operations according to the switch signal and the selection signal.

3. The switch device of claim 2, wherein the first transistor and the second transistor are in the same conduction type.

4. The switch device of claim 2, wherein the switch controller comprises a first switch signal generating circuit that comprises:

a third transistor, having a first terminal coupled to the first switch control signal output terminal, and a gate coupled to the second switch control signal output terminal;
    a fourth transistor, having a first terminal coupled to the third transistor first terminal, a second terminal coupled to the second terminal of the third transistor, and a gate coupled to the first referential voltage; and
    a fifth transistor, having a first terminal coupled to the second terminal of the third transistor and the second terminal of the fourth transistor, a second terminal coupled to the first referential voltage, and a gate coupled to the selection signal.

5. The switch device of claim 4, wherein the third transistor and the fourth transistor are in different conduction type, and the third transistor and the fifth transistor are in the same conduction type.

6. The switch device of claim 4, wherein the first switch signal generating circuit further comprises:
    a sixth transistor, having a first terminal coupled to the first switch control signal output terminal, and a gate coupled to the first referential voltage;
    a seventh transistor, having a first terminal coupled to the second terminal of the sixth transistor, and a second terminal coupled to the second referential voltage; and
    a first AND gate, having an output terminal coupled to the gate of the seventh transistor, and the first AND gate arranged to perform AND operations according to an inverse switch signal and the selection signal.

7. The switch device of claim 6, wherein the sixth transistor and the seventh transistor are in the same conduction type.

8. The switch device of claim 6, wherein the switch controller further comprises:
    an eighth transistor, having a first terminal coupled to the first referential voltage;
    a ninth transistor, having a first terminal coupled to the second terminal of the eighth transistor, and a second terminal coupled to the second switch control signal output terminal and the gate of the eighth transistor; and
    a tenth transistor, having a first terminal coupled to the second switch control signal output terminal, and a second terminal coupled to the first switch control signal output terminal.

9. The switch device of claim 8, wherein the switch controller further comprises:
    an eleven transistor, having a first terminal coupled to the first referential voltage, and a second terminal coupled to the gate of the tenth transistor and the gate of the ninth transistor;
    a twelve transistor, having a gate coupled to the gate of the eleven transistor, and a second terminal coupled to: the gate of the ninth transistor, the second terminal of the eleven transistor and the gate of the tenth transistor; and
    a thirteen transistor, having a first terminal coupled to the first terminal of the twelfth transistor, a second terminal coupled to the gate of the ninth transistor, and a gate coupled to the second switch control signal output terminal.

10. The switch device of claim 9, wherein the switch controller further comprises:
    a fourteen transistor, having a first terminal coupled to the second referential voltage, and a second terminal coupled to the second terminal of the eighth transistor via a capacitor;

a fifteen transistor, having a gate coupled to the first switch control signal output terminal, a first terminal coupled to the second terminal of the fourteen transistor, and a second terminal coupled to the input terminal;

a second AND gate, having an output terminal coupled to the gate of the fourteen transistor, the second AND gate arranged to perform AND operations according to the inverse switch signal and the selection signal; and a third AND gate, wherein having an output terminal coupled to the gate of the eleven transistor and the gate of the twelve transistor, the third AND gate arranged to perform AND operations according to the switch signal and the selection signal.

11. The switch device of claim 1, wherein when the voltage level of the input signal at the input terminal is larger than a power voltage, a voltage level of the first switch control signal equals to the power voltage, and the voltage level of the second switch control signal equals to zero.

12. The switch device of claim 1, wherein when the voltage level of the input signal at the input terminal is not larger than power voltage and the switch signal has a low logic level, the voltage levels of the first switch control signal and the second switch control signal are zero; and when the voltage level of the input signal at the input terminal is not larger than the power voltage and the switch signal has a high logic level, the voltage levels of the first switch control signal and the second switch control signal equal to the power voltage plus the voltage level of the input signal.

* * * * *